United States Patent

Bischoff et al.

[19]

[11] Patent Number: 5,973,391
[45] Date of Patent: *Oct. 26, 1999

[54] INTERPOSER WITH EMBEDDED CIRCUITRY AND METHOD FOR USING THE SAME TO PACKAGE MICROELECTRONIC UNITS

[75] Inventors: Peter G. Bischoff, Los Altos Hills; Ross W Stovall, Fremont, both of Calif.

[73] Assignee: Read-Rite Corporation, Milpitas, Calif.

[ * ] Notice: This patent issued on a continued prosecution application filed under 37 CFR 1.53(d), and is subject to the twenty year patent term provisions of 35 U.S.C. 154(a)(2).

[21] Appl. No.: 08/989,326

[22] Filed: Dec. 11, 1997

[51] Int. Cl.$^6$ .................................................. H01L 23/02
[52] U.S. Cl. ........................ 257/678; 257/697; 257/698; 257/724
[58] Field of Search ..................................... 257/686, 678, 257/531, 697, 698, 724, 728

[56] References Cited

U.S. PATENT DOCUMENTS

| | | | |
|---|---|---|---|
| 4,349,862 | 9/1982 | Bajorek et al. | 361/401 |
| 4,617,730 | 10/1986 | Geldermans et al. | 357/71 |
| 4,782,381 | 11/1988 | Ruby et al. | 257/724 |
| 4,939,568 | 7/1990 | Kato et al. | 257/686 |
| 5,070,317 | 12/1991 | Bhagat | 336/200 |
| 5,148,265 | 9/1992 | Khandros et al. . | |
| 5,148,266 | 9/1992 | Khandros et al. . | |
| 5,174,012 | 12/1992 | Hamilton . | |
| 5,177,594 | 1/1993 | Chance et al. | 257/678 |
| 5,258,330 | 11/1993 | Khandros et al. . | |
| 5,282,312 | 2/1994 | DiStefano et al. . | |
| 5,346,861 | 9/1994 | Khandros et al. . | |
| 5,347,159 | 9/1994 | Khandros et al. . | |
| 5,367,764 | 11/1994 | DiStefano et al. . | |
| 5,382,827 | 1/1995 | Wang et al. | 257/686 |
| 5,390,844 | 2/1995 | DiStefano et al. . | |
| 5,398,863 | 3/1995 | Grube et al. . | |
| 5,404,044 | 4/1995 | Booth et al. | 257/686 |

(List continued on next page.)

OTHER PUBLICATIONS

Shell Case Marketing and Technical Literature, "True Miniature Die Size IC Packaging Solution".

Levine, B. "Chip–Scale, Bare Die Face Challenges", Electronic News Article, vol. 43, No. 2149, Monday, Jan. 6, 1997.

*Primary Examiner*—Olik Chaudhuri
*Assistant Examiner*—Phat X. Cao
*Attorney, Agent, or Firm*—Robert King; Samuel A. Kassatly

[57] ABSTRACT

An interposer for assembly between an integrated circuit and a circuit panel includes an upper insulation layer and a plurality of upper contact pads arranged in a desired pattern in the upper insulation layer. A plurality of micro-devices are formed between the upper insulation layer and a bottom insulation layer having a plurality of lower contact pads arranged in a desired pattern. The upper and the lower contact pads are selectively and electrically interconnected via the micro-devices. The upper and the lower contact pads are overlaid with solder balls to provide the required electrical connection and mechanical coupling between the interposer, the integrated circuit, and the circuit panel. The interposer is made by forming an array of upper contact pads on a substrate; depositing an upper layer of encapsulant material on the substrate; planarizing the substrate and exposing the array of upper contact pads; forming a microdevice; forming an array of lower contact pads; forming a bottom insulation layer; and exposing at least some of the lower contact pads. According to another embodiment, the interposer includes a plurality of electrically conductive terminals that extend outwardly from the lower contact pads for establishing an electrical connection and a mechanical spring action between the integrated circuit and the interposer, in order to absorb excess contraction or expansion.

23 Claims, 6 Drawing Sheets

U.S. PATENT DOCUMENTS

| | | |
|---|---|---|
| 5,414,298 | 5/1995 | Grube et al. . |
| 5,426,072 | 6/1995 | Finnila .................................. 257/686 |
| 5,455,390 | 10/1995 | DiStefano et al. . |
| 5,477,611 | 12/1995 | Sweis et al. . |
| 5,489,749 | 2/1996 | DiStefano et al. . |
| 5,491,302 | 2/1996 | DiStefano et al. . |
| 5,518,964 | 5/1996 | DiStefano et al. . |
| 5,525,545 | 6/1996 | Grube et al. . |
| 5,536,909 | 7/1996 | DiStefano et al. . |
| 5,783,870 | 7/1998 | Mostafazadeh et al. ............... 257/791 |

INTERPOSER WITH EMBEDDED CIRCUITRY AND METHOD FOR USING THE SAME TO PACKAGE MICROELECTRONIC UNITS

FIELD OF THE INVENTION

The present invention relates to the field of electrical circuitry, and it particularly relates to the field of mounting and connection of components utilized in assembling and packaging microelectronic units, such as semiconductor chips.

BACKGROUND OF THE INVENTION

Electronic components are typically mounted on circuit panels consisting of multiple-layered dielectric sheets interspersed with conductors and vias arranged in a manner to properly connect surface-mounted devices. The electronic components that are generally mounted to circuit panels include discrete components, such as resistors and capacitors, and integrated circuits, with numerous sub-circuits embedded into a single semiconductor chip. Semiconductor chips are generally mounted onto chip carriers or mounting substrates which are then packaged before being mounted to the circuit panel with proper interconnecting leads. Circuit panels are generally formed of polymeric materials and chip carriers are generally made of ceramics or plastic. Semiconductor chips can also be mounted and connected directly to the circuit panel in a "hybrid circuit" configuration.

Semiconductor chips are commonly connected to electrically conductive traces on mounting substrates by various methods such as: wire bonding, tape automated bonding, and flip-chip bonding. In wire bonding, the chip is positioned on a substrate and individual wires are connected between the electrical contacts on the chip and pads on the substrate. In tape automated bonding, a flexible dielectric tape with a prefabricated array of cantilever leads thereon is positioned over the chip and the substrate. The individual leads are bonded to contacts on the chip. The leads are also connected to pads on the substrate. In both wire bonding and conventional tape automated bonding, the pads on the substrate are arranged outside of the area covered by the chip, so that the wires or leads fan out from the chip to the surrounding pads. The area covered by the subassembly as a whole is considerably larger than the area covered by the chip. Because the speed with which a microelectronic assembly can operate is inversely related to its size, this presents a serious drawback. Moreover, the wire bonding and tape automated bonding approaches are generally most workable with chips having contacts disposed in rows extending along the edges of the chip. They generally do not lend themselves to use with chips having contacts disposed in an area array, i.e., a gridlike pattern covering all or a substantial portion of the chip front surface.

In the flip-chip mounting technique, the contact bearing top surface of the chip faces towards the substrate. Each contact on the chip is joined by a solder bond to the corresponding pad on the substrate, as by positioning solder balls on the substrate or chip, juxtaposing the chip with the substrate in the front-face-down orientation and momentarily melting or reflowing the solder. The flip-chip technique yields a compact assembly which occupies a substrate area no larger than the area on the chip itself. However, flip-chip assemblies suffer from significant problems with stress caused by differential thermal expansion and contraction. The solder bonds between the chip contacts and substrate are substantially rigid. Changes in the size of the chip and of the substrate due to thermal expansion and contraction in service create substantial stresses in these rigid bonds, which, in turn, can lead to fatigue failure of the bonds.

Numerous attempts have been made to address the foregoing problems, and are described in U.S. Pat. Nos. 5,148,265; 5,148,266; 5,258,330; 5,282,312; 5,346,861; 5,347,159; 5,367,764; 5,398,863; 5,414,298; 5,455,390; 5,477,611; 5,489,749; 5,491,302; 5,518,964; 5,525,545; and 5,536,909. Exemplary embodiments of the structures disclosed in these patents incorporate flexible, sheet-like structures referred to as "interposers" or "chip carriers". The preferred chip carriers have a plurality of terminals disposed on a flexible, sheet-like top layer. In use, the interposer is disposed on the front or contact bearing surface of the chip with the terminals facing upwardly, away from the chip. The terminals are then connected to the contacts of the chip. This connection is made by bonding prefabricated leads on the interposer to the chip contacts, using a tool engaged with the lead. The completed assembly is then connected to a substrate, as by bonding the terminals of the chip carrier to the substrate. Because the leads and the dielectric layer of the chip carrier are flexible, the terminals on the chip carrier can move relative to the contacts on the chip without imposing significant stresses on the bonds between the leads and the chip, or on the bonds between the terminals and the substrate. Thus, the assembly can compensate for thermal effects. Moreover, the assembly includes a compliant layer disposed between the terminals on the chip carrier and the face of the chip itself as, for example, an elastomeric layer incorporated in the chip carrier and disposed between the dielectric layer of the chip carrier and the chip. Such a compliant structure permits displacement of the individual terminals independently of the chip.

Despite these and other advances in the art, it would be desirable to provide further improvements in semiconductor chip assemblies, components for these assemblies, and methods for making the same. These improvements should help reduce the noise generated by the integrated circuit package, minimize the external wiring between the chip carrier and the circuit panel, and allow the economical incorporation of normally externally mounted passive devices such as signal-conditioning and inductive components into a chip package with approximately the same footprint as the integrated circuit itself.

SUMMARY OF THE INVENTION

One aspect of the present invention is to provide an interposer for assembly between an integrated circuit and a circuit panel. The interposer includes an upper insulation layer and a plurality of upper contact pads arranged in a desired pattern in the upper insulation layer. A plurality of micro-devices are formed between the upper insulation layer and a bottom insulation layer having a plurality of lower contact pads arranged in a desired pattern. The upper and the lower contact pads are selectively and electrically interconnected via the micro-devices. The upper and the lower contact pads are overlaid with solder balls to provide the required electrical connection and mechanical coupling between the interposer, the integrated circuit, and the circuit panel. The interposer may improve the performance of the integrated circuit to which it is secured.

The interposer is made by forming an array of upper contact pads on a substrate; depositing an upper layer of encapsulant material on the substrate; planarizing the substrate and exposing the array of upper contact pads; forming a micro-device; forming an array of lower contact pads; forming a bottom insulation layer; and exposing at least some of the lower contact pads.

Another aspect of the present invention is to provide an interposer for assembly between an integrated circuit and a circuit panel. The interposer includes an upper insulation layer and a plurality of upper contact pads arranged in a desired pattern in the upper insulation layer. A plurality of micro-devices are formed between the upper insulation layer and a bottom insulation layer having a plurality of lower contact pads arranged in a desired pattern. The upper and the lower contact pads are selectively and electrically interconnected via the micro-devices. The upper contact pads are overlaid with solder balls to provide the required electrical connection and mechanical coupling between the interposer and the circuit panel. A plurality of electrically conductive terminals extend outwardly from the lower contact pads, and establish an electrical connection and a mechanical spring action between the integrated circuit and the interposer to absorb excess contraction or expansion.

The interposer is made by forming an array of upper contact pads on a substrate; depositing an upper layer of encapsulant material on the substrate; planarizing the substrate and exposing the array of upper contact pads; forming a micro-device; forming an array of lower contact pads; forming a plurality of electrically conductive terminals that extend outwardly from the lower contact pads, which establish an electrical connection and a mechanical spring action between the integrated circuit and the interposer to absorb excess contraction or expansion, and to form a bottom insulation layer.

According to another embodiment, the interposer includes a plurality of electrically conductive terminals that extend outwardly from the lower contact pads for establishing an electrical connection and a mechanical spring action between the integrated circuit and the interposer, in order to absorb excess contraction or expansion.

BRIEF DESCRIPTION OF THE DRAWINGS

The features of the present invention and the manner of attaining them will become apparent, and the invention will be understood by reference to the following description and the accompanying drawings, wherein.

Similar numerals refer to similar elements in the drawings. It should be understood that the sizes of the different components in the figures may not be in exact proportion, and are shown for visual clarity and for the purpose of explanation.

DETAILED DESCRIPTION OF THE PREFERRED EMBODIMENTS

Figure 1:
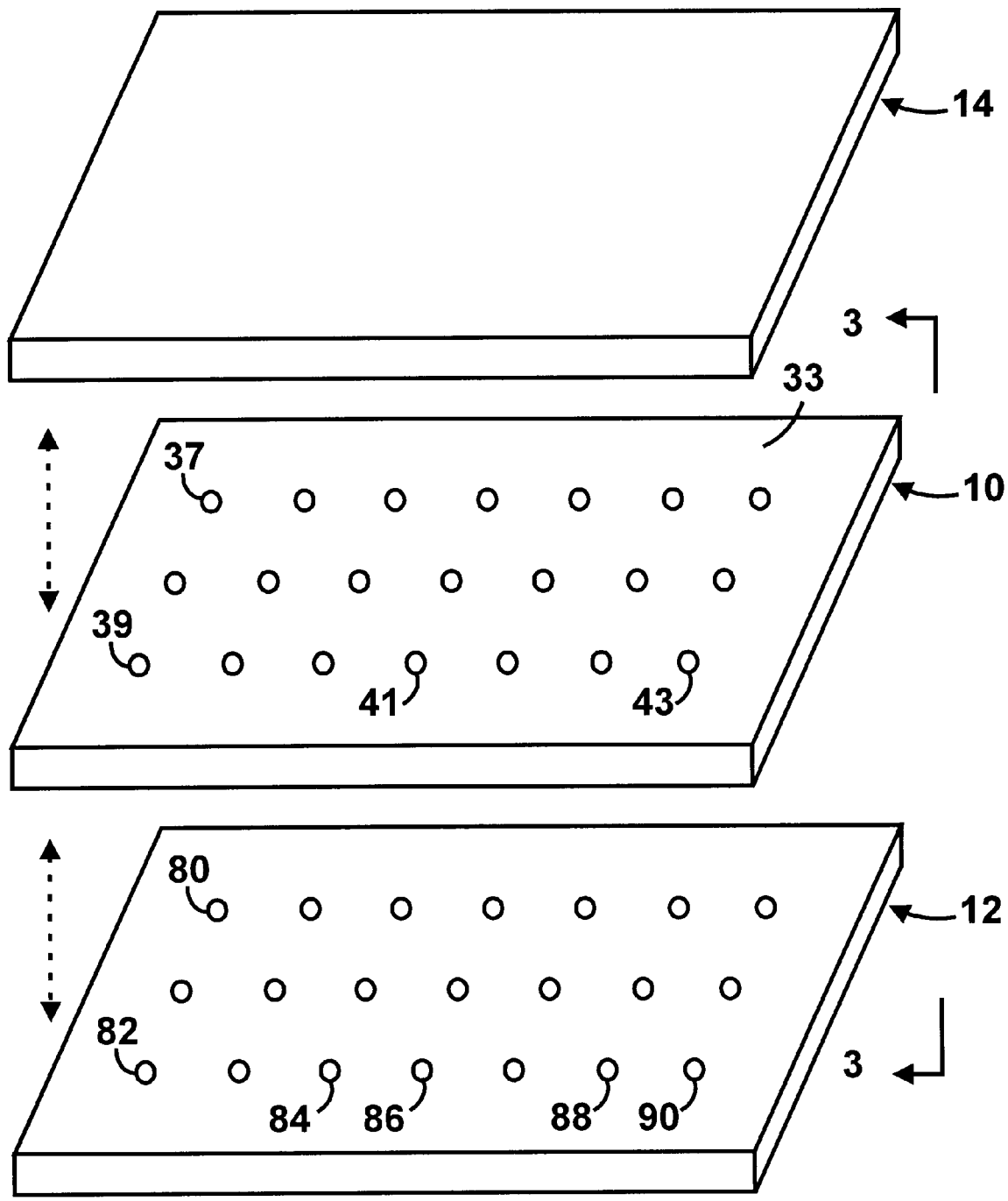
FIG. 1 is an exploded, perspective view of an interposer made according to the present invention, for assembly to an integrated circuit and a circuit panel.
Figure 2:
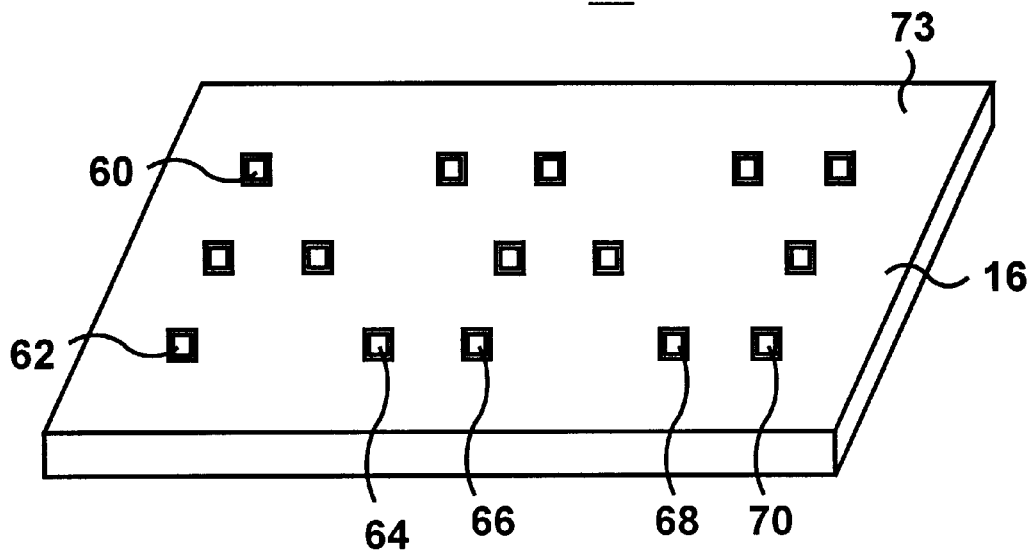
FIG. 2 is a perspective bottom view of the interposer of FIG. 1.
Figure 3:
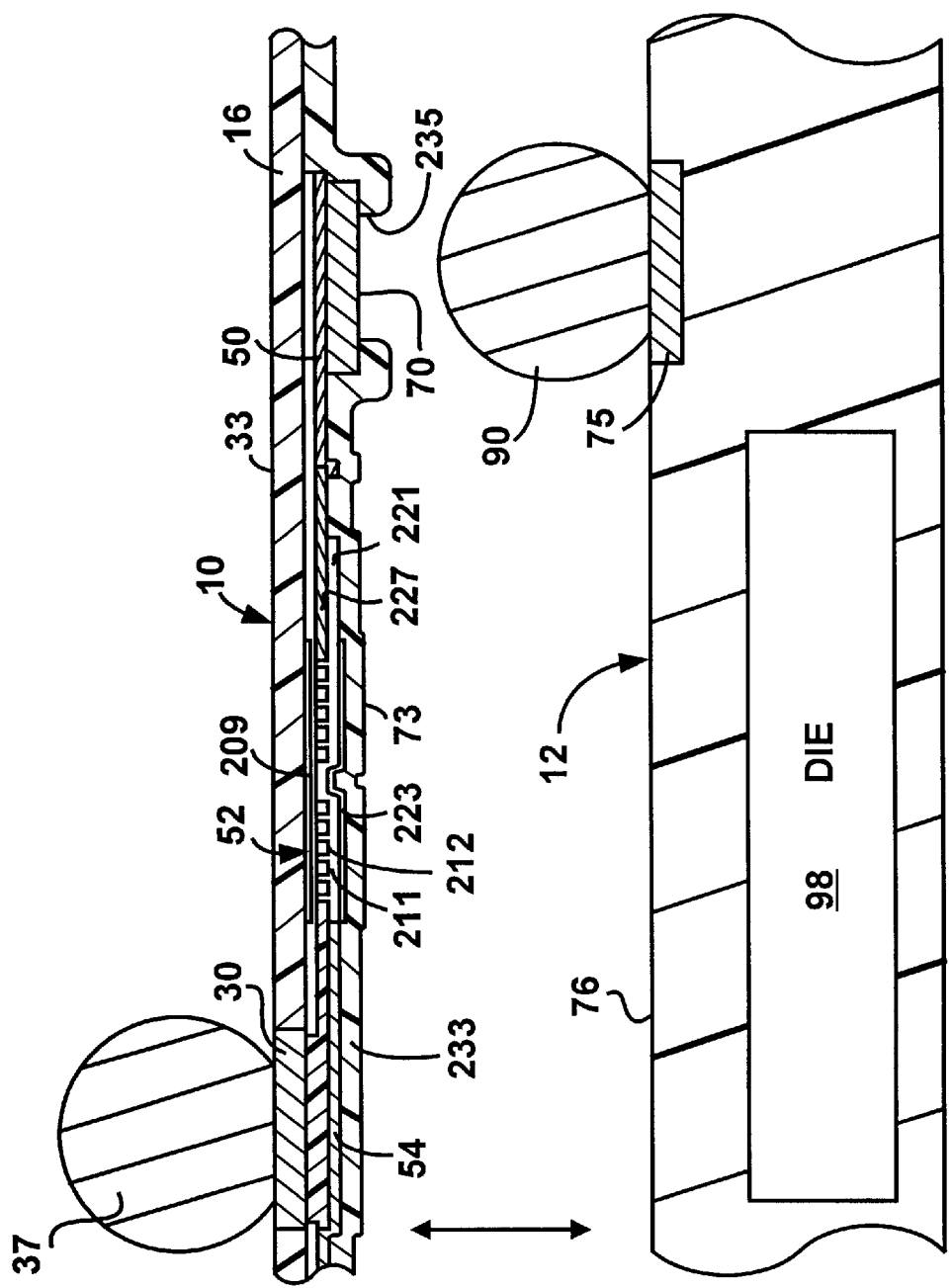
FIG. 3 is a greatly enlarged, exploded, cross-sectional, fragmentary, side elevational view of the interposer shown juxtaposed and in alignment with the integrated circuit, taken along line 3—3 of FIG. 1.

With reference to the drawings and more particularly to FIGS. 1 and 3 thereof, they illustrate an interposer (also referred to as a mounting component) 10 made according to the present invention, for assembly between an integrated circuit 12 and a circuit panel (also referred to as circuit board) 14. In one embodiment, the integrated circuit 12 is formed of silicon or similar other material used in the manufacture of integrated circuits. The circuit panel 14 is made of ceramic material used in the formation of circuit panels. The interposer 10 includes an upper insulation layer 16 that is preferably made of alumina or another similar insulating and encapsulating material, such as silicon dioxide. The expansion coefficient of the interposer 10 sufficiently matches those of the integrated circuit 12 and the circuit panel 14, thus significantly minimizing stress caused by the differential thermal expansion and contraction of the various constituent materials over the intended operating range. The dimensions of the interposer 10 vary with the overall design of the assembly comprised of the interposer 10, the integrated circuit 12 and the circuit panel 14. The interposer 10 may however be as thin as a few mils.

The interposer 10 includes a plurality of upper contact pads arranged in a desired pattern on any part of the interposer upper surface 33. Only one upper contact pad 30 is shown in FIG. 3 for illustration purpose. A solder ball 37 is placed on each upper contact pad 30 (FIG. 3). FIG. 1 shows a pattern of solder balls 37, 39, 41, 43 that overlay corresponding upper pads 30. In certain embodiments it may be desirable to overlay only selected upper contact pads 30 with solder balls 37 whose pattern generally corresponds to the pattern of connections to micro-devices, such as semiconductor chips and discrete components 50, 52, 54 (FIG. 3) mounted within the interposer 10. While the present invention is described with respect to solder balls, it should be clear that alternative electrical connection techniques (or electrical connectors) may be used.

The pattern of the upper contact pads 30 corresponds to a matching pattern of contact pads (not shown) on the bottom surface of the circuit panel 14. As used herein, the term "bottom" is interchangeable with the term "lower". When the interposer 10 is juxtaposed with the circuit panel 14, the solder balls 37, 39, 41, 43 overlaying the upper contact pads 30 are aligned with the contact pads on the bottom surface of the circuit panel 14. The solder balls 37, 39, 41, 43 are melted by heating the interposer 10 and the circuit panel 14. As the molten solder cools and hardens, it establishes a mechanical and electrical connection between the interposer 10 and the circuit panel 14.

With reference to FIGS. 1 through 4, the interposer 10 further includes a plurality of lower contact pads 60, 62, 64, 66, 68, 70 that are arranged in a desired pattern on any part of the bottom surface 73 of the interposer 10. The pattern of the lower contact pads 60, 62, 64, 66, 68, 70 generally corresponds to a matching pattern of contact pads (only one of which 75, is illustrated in FIG. 3) on the upper surface 76 of the integrated circuit 12. These contact pads 75 are overlaid with corresponding solder balls 80, 82, 84, 86, 88, 90 (FIG. 1), and their patten corresponds to the pattern of connections to micro-devices, such as semiconductor chips and discrete electronic components contained within a die 98, which is illustrated by a block.

When the interposer 10 is juxtaposed with the integrated circuit 12, the solder balls 80, 82, 84, 86, 88, 90 overlaying the contact pads on the upper surface 76 of the integrated circuit 12 match the lower contact pads 60, 62, 64, 66, 68, 70 on the bottom surface 73 of the interposer 10. The solder balls 80, 82, 84, 86, 88, 90 are melted by heating the interposer 10 and the integrated circuit 12. As the molten solder cools and hardens, it establishes a mechanical and electrical connection between the interposer 10 and the integrated circuit 12.

In a preferred embodiment, the interposer 10 is assembled to the integrated circuit 12 as described above. The interposer (10)—integrated circuit (12) unit may be marketed separately for subsequent assembly to the circuit panel 14. Alternatively, the interposer 10 is assembled to the circuit panel 14 as described above, and the interposer (10)—circuit panel (14) unit may be marketed separately for subsequent assembly to the integrated circuit 12. According to still another method, the interposer 10, the integrated circuit 12, and the circuit panel 14 may be almost simultaneously assembled, robotically or manually.

Figure 4:
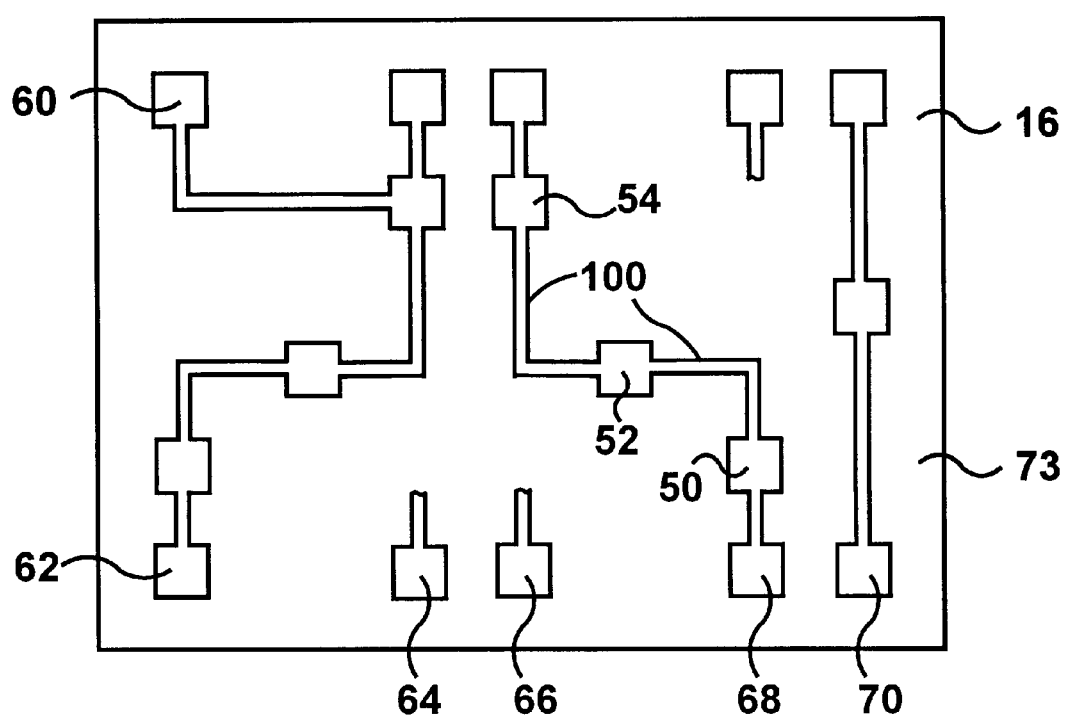
FIG. 4 is a diagrammatic, bottom plan topographic view of the interposer of FIGS. 1, 2 and 3, illustrating exemplary electrical interconnections between a plurality of contact pads and microelectronic units mounted within the interposer.

With reference to FIGS. 3 and 4, the upper contact pads 30 and the lower contact pads 60, 62, 64, 66, 68, 70 are selectively interconnected by means of conductive wiring or traces 100, via the micro-devices 50, 52, 54 (FIG. 3) mounted within the interposer 10. In the exemplary embodiment shown in FIG. 1, the lower contact pad 70 is electrically connected to the upper contact pad 30, via an internal conductive path containing the micro-device 50 (i.e., a resistor), the micro-device 52 (i.e., an inductor), and the micro-device 54 (i.e., a capacitor). It should be understood that other discrete components and integrated circuits, for example chokes, transformers, delay lines, etc. may be selectively designed and formed, as desired, within the interposer 10.

When the interposer 10 is secured to the integrated circuit 12 and the circuit panel 14, an electrical conductive path is established between the contact pad 75 of the integrated circuit 12, the solder ball 90, the internal conductive path formed within the interposer 10 as described above, the solder ball 37, and a corresponding contact pad (not shown) forming part of the circuit panel 14. Consequently, the present invention realizes the unprecedented ability to reduce noise generated by the integrated circuit 12; to minimize external wiring between the integrated circuit 12 and the circuit panel 14; and to economically incorporate signal conditioning and inductive components within the interposer 10 that has approximately the same footprint as the integrated circuit 12.

The various contact pads are made of conductive material, preferably gold traces. While only a few contact pads are illustrated, it should be clear that a significantly greater number of contact pads may be designed and used. The terms "top", "bottom", "upper", and "lower" are used herein to indicate directions relative to the interposer 10 as shown in FIG. 1. It should be understood that the frame of reference is not necessarily to the ordinary, gravitational frame of reference.

Figure 5:
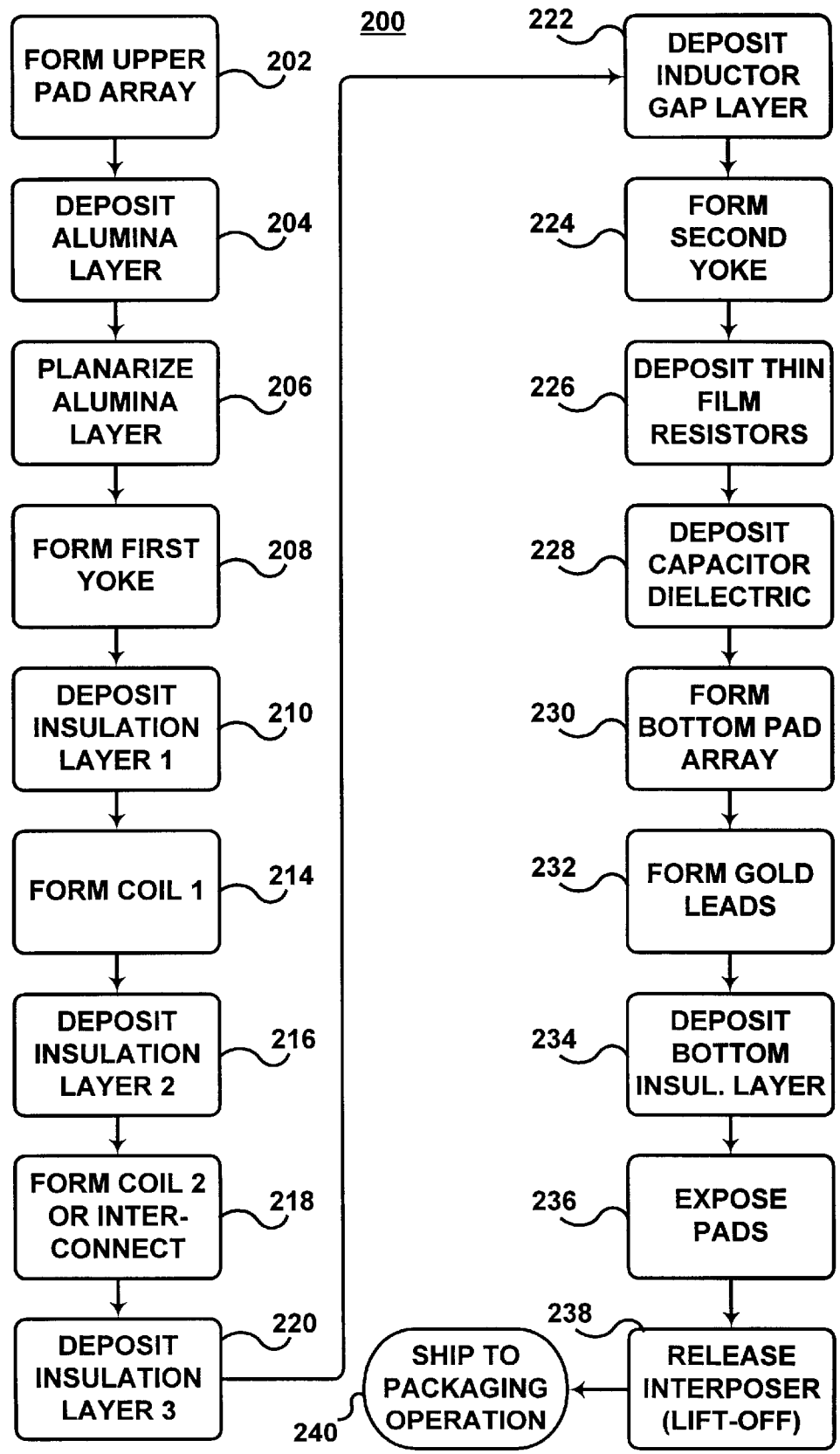
FIG. 5 is a flow chart illustrating the process of making the interposer of FIGS. 1 through 4.

The interposer 10 may be made using the processing methods described in U.S. Pat. No. 5,174,012 to Hamilton, which is incorporated herein by reference. The interposer 10 is formed using wafer/thin film processing techniques. FIG. 5 illustrates one such process 200, according to which the array of upper pads 30 are formed at step 202 by depositing gold traces on a thin etchable layer (not shown). In this example, the etchable layer is composed of a thin metallic film (for example copper) of approximately 1000 Å (Angstroms) that is sputter or evaporation deposited on a wafer (not shows), which is electroplated to form an etchable layer of copper approximately 3 to 20 microns thick. The method of making a read/write structural unit on a supporting substrate by forming an etchable layer on the substrate, and subsequently etching the etchable layer to free the body from the substrate, as described in U.S. Pat. No. 5,174,012 to Hamilton.

After the upper pad array is formed at step 202, the upper layer 16 of alumina is deposited (for instance by sputtering), on the etchable layer, at step 204. The upper layer 16 is also referred to as the base encapsulant layer, and it provides mechanical strength to the interposer 10. At step 206 the upper layer 16 is lapped until it is planarized, and the upper pad array is exposed. At step 208 a first yoke 209 of the inductor 52 is formed using available photolithography and plating techniques. The first yoke 209 is preferably formed of permalloy (NiFe). At step 210 a first insulation layer 211 of the inductor 52 is deposited on the first yoke 209, and a first inductive coil layer 212 is formed within the first insulation layer 211 (FIG. 3) at step 214. The coil layer 212 is made of an electrically conductive material, preferably copper.

In a multi-staged or multi-layered design according to the present invention, one or more additional layers of inductive coil layers and insulation layers may be similarly interposed on top, to reach the desired inductance, as illustrated by the exemplary steps 216, 218 and 220. If needed, an inductor gap layer 221 composed for instance of alumina, is deposited on the uppermost insulation layer at step 222, and a second yoke 223 preferably formed of permalloy (NiFe), is deposited on the inductor gap layer 221 at step 224, which completes the formation of the inductor 52.

The resistor (or a resistor array composed of a plurality of resistors) 50 is formed at step 226 by depositing a thin film resistive layer. In the present illustration, an electrically conductive trace 227 extends from the coil 212, and is connected to the resistor 50, for connecting the inductor 52 to the resistor 50. If needed, the capacitor (or a capacitor array composed of a plurality of capacitors) 54 is formed at step 228, by sequentially depositing a first conductive layer, followed by an insulation layer and a second conductive layer.

The lower contact pads 60, 62, 64, 66, 68, 70 are formed at step 230. Step 232 is optional, and is relevant to the interposer 120 described below in connection with FIGS. 6 and 7. According to step 232, gold leads 188 form the central terminals 121, 123, 124, 125.

A bottom insulation layer 233 preferably made of alumina or another similar insulating and encapsulating material, such as silicon dioxide is formed. If some or all the lower contact pads 60, 62, 64, 66, 68, 70 were to be exposed, as is shown in FIG. 3 with regard to the interposer 10, vias or openings 235 are formed by selectively etching the bottom insulation layer 233 (step 236).

The wafer on which the array of interposers 10 is formed is then immersed in an etchant solution for dissolving the etchable layer of copper, thus causing the array of interposers 10 to be released from the wafer (step 238). The etchant solution is of a composition that selectively etches away copper. The individual interposers 10 are then shipped for subsequent processing or packaging (step 240).

An important aspect of the present invention is the ability to economically design and form an inductive micro-device 52 embedded within the interposer 10. The inductive micro-device 52 may be an inductor, or a magnetic coil assembly as described in the U.S. patent application titled "Magnetic Coil Assembly", Ser. No. 08/844,003, which is incorporated herein by reference. The remaining micro-devices 50, 54 may be formed using conventional thin-film techniques, including sputtering, photolithography, plating, or etching, prior to etching away the copper release layer.

Figure 6:
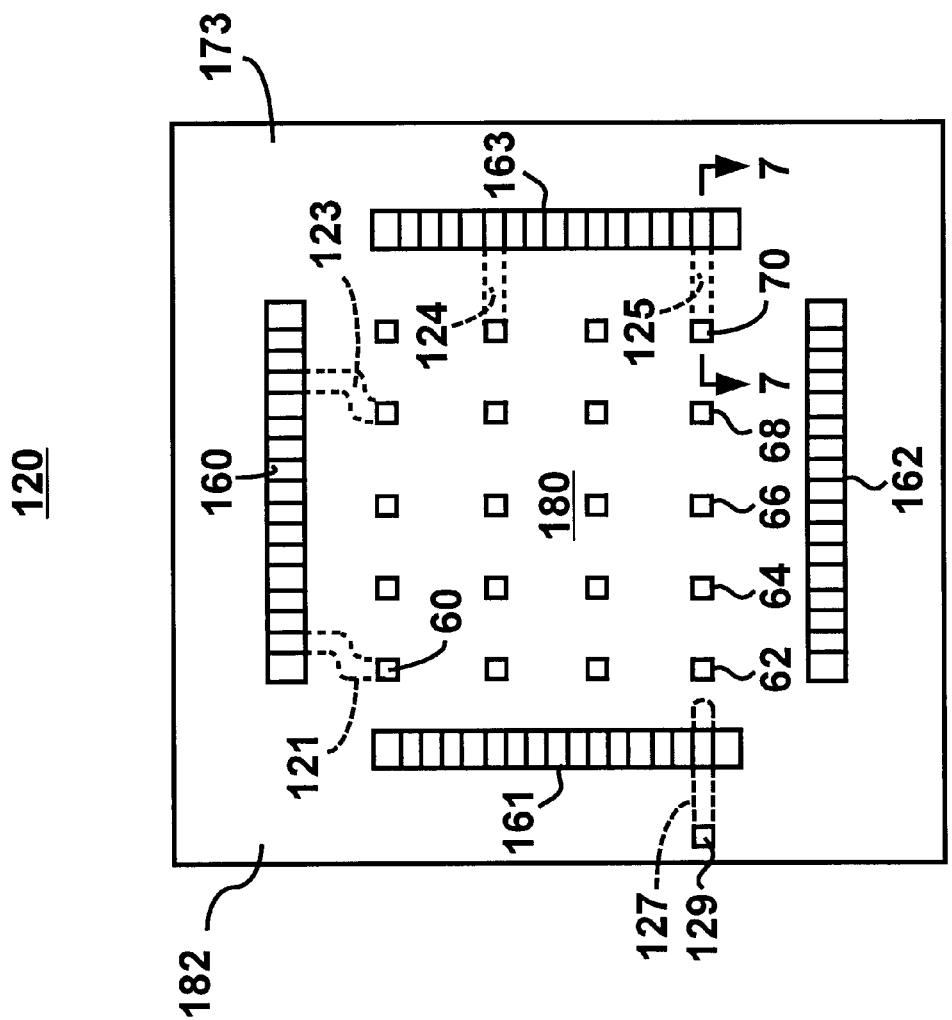
FIG. 6 is a bottom plan view of another interposer according to the present invention.
Figure 7:
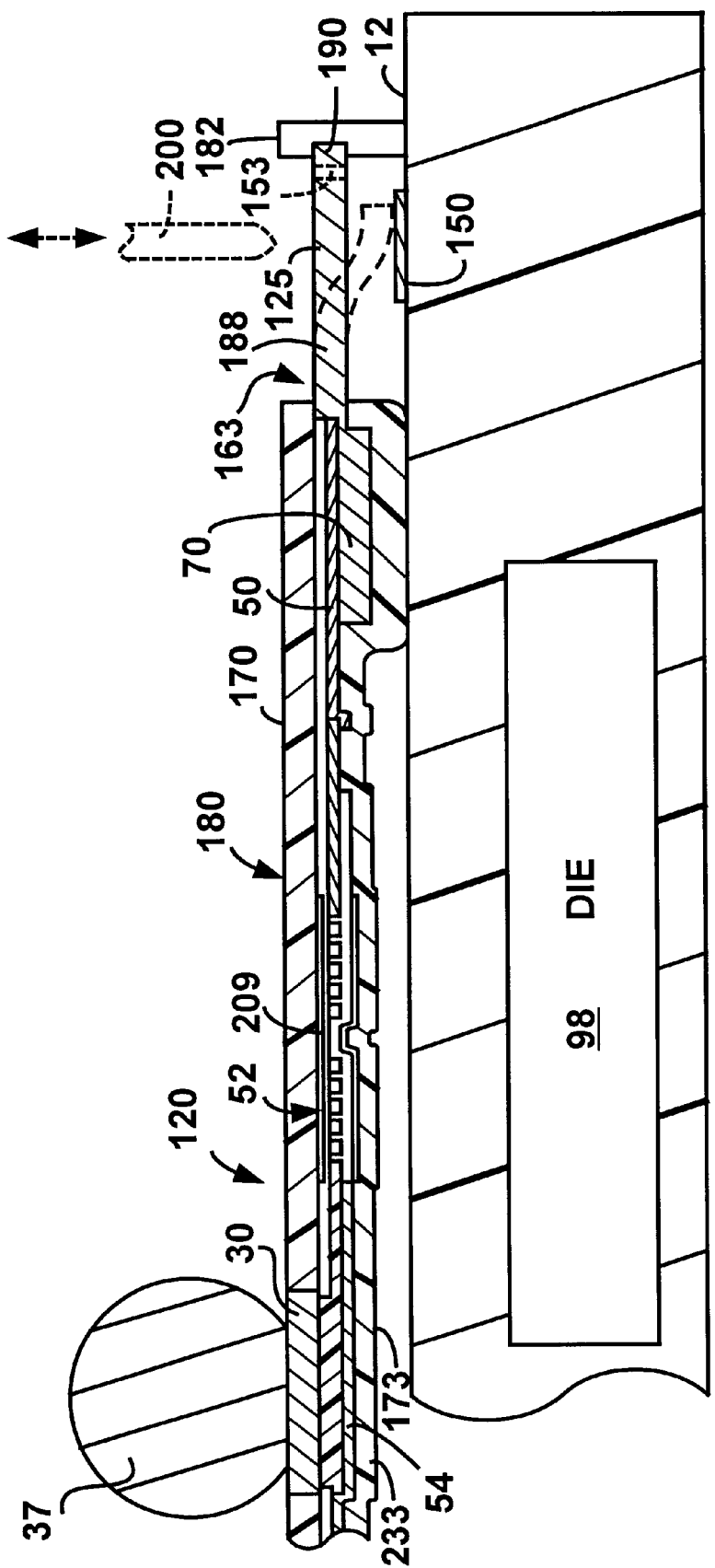
FIG. 7 is a greatly enlarged cross-sectional, fragmentary, side elevational view of the interposer taken along line 7—7 of FIG. 6, shown atop an integrated circuit.

While the interposer 10 provides an efficient match between ceramic-based circuit panels 14, the interposer 120 shown in FIGS. 6 and 7 provides an efficient match between plastic or polyimide-based circuit panels 14 having much greater differential thermal expansion and contraction. The interposer 120 employs additional spring action to absorb excess expansion or contraction.

The interposer 120 is generally similar to the interposer 10, except that the interposer 120 uses a different method for electrically connecting the interposer 120 to the integrated circuit 12. Rather than using solder balls 80, 82, 84, 86, 88, 90 (FIG. 1), the interposer 120 includes a plurality of electrically conductive central terminals, i.e., 121, 123, 124, 125 that extend outwardly from the lower contact pads 60, 62, 64, 66, 68, 70. The interposer 120 may further include a plurality of peripheral terminals disposed in a desired pattern and extending inwardly from peripheral contact pads, i.e., 129. Only one peripheral terminal 127 is shown for the purpose of illustration. FIG. 7 illustrates the formation of an electrical connection between the lower contact pad 70 of the interposer 120 and a contact pad 150 on (or embedded at least in part within) the integrated circuit 12, by breaking the terminal 125 at a frangible section 153, and forcing it downwardly in contact with the pad 150. The terminals 121, 123, 124, 125 replace (or supplement) the solder balls 90.

While the terminals 121, 123, 124, 125, 127 are described as connecting the lower contact pads 60, 62, 64, 66, 68, 70 of the interposer 120, it should be clear that the terminals 121, 123, 124, 125, 127 may be used to interconnect the upper contact pads 30 to contact pads on the circuit panel 14.

The interposer 120 includes a plurality of generally similar elongated slots 160, 161, 162, 163, four of which are illustrated. Each slot, for example representative slot 163, extends through the interposer 120, from the top surface 170 to the bottom surface 173. The slots 160, 161, 162, 163 divide the interposer 120 into an inner section 180 substantially bounded by the slots 160, 161, 162, 163, and an outer peripheral section 182 disposed outside of the slots 160, 161, 162, 163. While the slots 160, 161, 162, 163 are shown to be peripherally disposed relative to the interposer 120, it should be clear that these and other slots may be placed at any desired position across the surface of the interposer 120.

The central terminals 121, 123, 124, 125 are disposed on the central section 180 and the peripheral terminals 127 are disposed on the peripheral section 182. For simplicity of illustration, FIG. 6 depicts only a relatively small number of central and peripheral terminals. In actual practice, however, there may be a much greater number of terminals. Each central terminal, for example central terminal 125 (FIG. 7) includes a terminal lead 188 disposed between the upper surface 170 and the bottom surface 173 of the interposer 120, and extending across the associated slot 163. Each central terminal 125 further includes a frangible section 153 that lies within the slot 163, and a peripheral end 190 secured within the peripheral section 182.

The central terminal 125 is forced into contact with the contact pad 150 of the integrated circuit 12 by means of a bonding tool 200 that exerts sufficient force on the central terminal 125 to break the lead 188 at the frangible section 153. The bonding tool 200 then bonds the free end of the lead 188 to the contact pad 150 by means of available techniques, for instance ultra-sonically. The bonding tool 200 is retracted and the bonding operation is repeated as needed to bond all the central and peripheral terminals. Each central terminal 125 creates a spring action which absorbs excess contraction or expansion.

While one exemplary method has been described to connect the interposer 120 to the integrated circuit 12, it should be appreciated that other connection and bonding methods may alternatively be selected, without affecting the scope of the present invention. Some of these methods and associated bonding tools are described for example in U.S. Pat. Nos. 5,148,265; 5,148,266; 5,258,330; 5,282,312; 5,346,861; 5,347,159; 5,367,764; 5,390,844; 5,398,863; 5,414,298; 5,455,390; 5,477,611; 5,489,749; 5,491,302; 5,518,964; 5,525,545; and 5,536,909, all of which are incorporated herein by reference.

It should be understood that the geometry, compositions, and dimensions of the elements described herein may be modified within the scope of the invention. Other modifications may be made when implementing the invention for a particular environment.

What is claimed is:

1. A chip carrier for assembly intermediate an integrated circuit having a footprint and a circuit panel, comprising:

an upper thin film insulation layer having an expansion/contraction coefficient substantially matching an expansion/contraction coefficient of the circuit panel, and having a footprint which is approximately equal to the integrated circuit footprint;

a plurality of upper contact pads arranged in a desired pattern, and disposed at least in part within said upper insulation layer;

a bottom thin film insulation layer having an expansion/contraction coefficient substantially matching an expansion/contraction coefficient of the integrated circuit, and having a footprint which is approximately equal to the integrated circuit footprint;

a plurality of lower contact pads arranged in a desired pattern, and disposed at least in part within the bottom insulation layer;

a plurality of thin film micro-devices formed between said upper insulation layer and said bottom insulation layer;

at least some of said plurality of upper contact pads and lower contact pads being selectively electrically interconnected via said micro-devices, such that the chip carrier has an overall footprint which is substantially equal to the footprint of the integrated circuit; and wherein one of said micro-devices is an inductor comprised of a first yoke, a first insulation layer deposited on said first yoke, and a first inductive coil layer formed within said first insulation layer.

2. A chip carrier as recited in claim 1, wherein said micro-devices further include a semiconductor chip.

3. A chip carrier as recited in claim 1, wherein said micro-devices further include a discrete component.

4. A chip carrier as recited in claim 1, further including a pattern of lower electrical connectors selectively overlaying at least some of said lower contact pads.

5. A chip carrier as recited in claim 4, wherein said pattern of lower electrical connectors corresponds to a substantially matching pattern of contact pads on the integrated circuit.

6. A chip carrier as recited in claim 1, further including a pattern of upper electrical connectors selectively overlaying at least some of said upper contact pads.

7. A chip carrier as recited in claim 6, wherein said pattern of upper electrical connectors corresponds to a substantially matching pattern of contact pads on the circuit panel.

8. A chip carrier as recited in claim 5, further including a pattern of upper electrical connectors selectively overlaying at least some of said upper contact pads; and wherein said pattern of upper electrical connectors corresponds substantially to a matching pattern of contact pads on the circuit panel.

9. A chip carrier as recited in claim 8, wherein at least some of said upper electrical connectors and at least some of said lower electrical connectors include solder balls.

10. A chip carrier as recited in claim 8, wherein when the chip carrier is secured to the integrated circuit and to the circuit panel, an electrical conductive path is established between at least some of the contact pads of the integrated circuit, at least some of said plurality of lower contact pads, at least some of said plurality of micro-devices, at least some of said plurality of upper contact pads, and at least some of the contact pads on the circuit panel.

11. A chip carrier as recited in claim 8, wherein the integrated circuit is formed of silicon.

12. A chip carrier as recited in claim 8, wherein the circuit panel is made of ceramic.

13. A chip carrier as recited in claim 8, wherein said upper insulation layer is made of any of alumina or silicon dioxide; and wherein said bottom insulation layer is made of any of alumina or silicon dioxide.

14. A chip carrier as recited in claim 1, wherein said micro-devices further include a capacitor.

15. A chip carrier as recited in claim 1, wherein said micro-devices further include a resistor.

16. A chip carrier as recited in claim 1, wherein said first yoke is formed of permalloy (NiFe).

17. A chip carrier as recited in claim 1, wherein at said micro-devices further include one or more additional layers of inductive coil layers and insulation layers.

18. A chip carrier as recited in claim 17, further including an inductor gap layer deposited on an uppermost insulation layer, and a second yoke preferably deposited on said inductor gap layer.

19. A chip carrier for assembly intermediate an integrated circuit having a footprint and a circuit panel, comprising:

an upper thin film insulation layer having a footprint which is approximately equal to the integrated circuit footprint;

a plurality of upper contact pads arranged in a desired pattern, and disposed at least in part within said upper insulation layer;

a bottom thin film insulation layer having a footprint which is approximately equal to the integrated circuit footprint;

a plurality of lower contact pads arranged in a desired pattern, and disposed at least in part within the bottom insulation layer;

a plurality of thin film micro-devices formed between said upper insulation layer and said bottom insulation layer;

at least some of said plurality of upper contact pads and lower contact pads being selectively electrically interconnected via said micro-devices, such that the chip carrier has an overall footprint which is substantially equal to the footprint of the integrated circuit;

a plurality of electrically conductive terminals extending outwardly from said lower contact pads, and establishing electrical connection and a mechanical spring action between the integrated circuit and the chip carrier for absorbing excess contraction or expansion; and wherein one of said micro-devices is an inductor comprised of a first yoke, a first insulation layer deposited on said first yoke, and a first inductive coil layer formed within said first insulation layer.

20. A chip carrier as recited in claim 19, wherein said micro-devices include any or more of a semiconductor chip, an inductor, a resistor, or a capacitor.

21. A chip carrier for assembly intermediate an integrated circuit having a footprint and a circuit panel, comprising:

an upper thin film insulation layer having a footprint which is approximately equal to the integrated circuit footprint;

a plurality of upper contact pads arranged in a desired pattern, and disposed at least in part within said upper insulation layer;

a bottom thin film insulation layer having a footprint which is approximately equal to the integrated circuit footprint;

a plurality of lower contact pads arranged in a desired pattern, and disposed at least in part within the bottom insulation layer;

a plurality of thin film micro-devices formed between said upper insulation layer and said bottom insulation layer, such that the chip carrier has an overall footprint which is substantially equal to the footprint of the integrated circuit;

at least some of said plurality of upper contact pads and lower contact pads being selectively electrically interconnected via said micro-devices; and a plurality of electrically conductive terminals extending outwardly from said upper contact pads, and establishing electrical connection and a mechanical spring action between the circuit panel and the chip carrier for absorbing excess contraction or expansion; and wherein one of said micro-devices is an inductor comprised of a first yoke, a first insulation layer deposited on said first yoke, and a first inductive coil layer formed within said first insulation layer.

22. A chip carrier as recited in claim 21, further including a pattern of upper electrical connectors selectively overlaying at least some of said upper contact pads;

wherein said pattern of upper electrical connectors corresponds to a substantially matching pattern of contact pads on the circuit panel;

wherein at least some of said upper electrical connectors and at least some of said lower electrical connectors include solder balls; and wherein when the chip carrier is secured to the integrated circuit and to the circuit panel, an electrical conductive path is established between at least some of the contact pads of the integrated circuit, at least some of said plurality of lower contact pads, at least some of said plurality of micro-devices, at least some of said plurality of upper contact pads, and at least some of the contact pads on the circuit panel.

23. A chip carrier as recited in claim 21, wherein the integrated circuit is formed of silicon;

wherein the circuit panel is made of ceramic;

wherein said upper insulation layer is made of any of alumina or silicon dioxide; and wherein said bottom insulation layer is made of any of alumina or silicon dioxide.

\* \* \* \* \*